(12) United States Patent
Lin et al.

(10) Patent No.: US 9,613,886 B2
(45) Date of Patent: Apr. 4, 2017

(54) OPTICAL COUPLING MODULE

(71) Applicant: Industrial Technology Research Institute, Hsinchu (TW)

(72) Inventors: Jui-Ying Lin, Hsinchu County (TW); Chia-Hsin Chao, Taichung (TW); Shu-Mei Yang, Hsinchu County (TW); Chun-Hsing Lee, Hsinchu (TW); Chien-Chun Lu, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 35 days.

(21) Appl. No.: 14/472,390

(22) Filed: Aug. 29, 2014

(65) Prior Publication Data
US 2015/0063745 A1  Mar. 5, 2015

Related U.S. Application Data

(60) Provisional application No. 61/871,319, filed on Aug. 29, 2013.

(51) Int. Cl.
*G02B 6/12* (2006.01)
*H01L 23/48* (2006.01)
(Continued)

(52) U.S. Cl.
CPC .............. *H01L 23/481* (2013.01); *G02B 6/12* (2013.01); *G02B 6/34* (2013.01);
(Continued)

(58) Field of Classification Search
CPC ........... G02B 6/12; G02B 6/34; H01L 23/481; H01L 23/13; H01L 23/147;
(Continued)

(56) References Cited

U.S. PATENT DOCUMENTS

| | | | | | |
|---|---|---|---|---|---|
| 5,208,882 A | * | 5/1993 | Strasser | ................... | G02B 6/34 385/130 |
| 5,568,574 A | * | 10/1996 | Tanguay, Jr. | ............. | G02B 5/32 359/15 |

(Continued)

FOREIGN PATENT DOCUMENTS

| AT | EP 2860560 A1 | * | 4/2015 | ............... G02B 6/43 |
|---|---|---|---|---|
| JP | 2011133536 | * | 7/2011 | ............... G02B 6/34 |
| TW | 201028748 | | 8/2010 | |

OTHER PUBLICATIONS

Dirk Taillaert, et al., "Compact efficient broadband grating coupler for silicon-on-insulator waveguides," Optics Letters, Dec. 1, 2004, vol. 29, No. 23, pp. 2749-pp. 2751.

(Continued)

*Primary Examiner* — Thomas A Hollweg
*Assistant Examiner* — Guy Anderson
(74) *Attorney, Agent, or Firm* — Jianq Chyun IP Office

(57) ABSTRACT

An optical coupling module includes a silicon photonic substrate, and an optical waveguide module. The silicon photonic substrate has a first surface and a first grating on the first surface for diffracting the light which passes through the grating. The optical waveguide module is disposed on the silicon photonic substrate, wherein the optical waveguide module includes an optical waveguide having an end disposed in corresponding to the first grating of the silicon photonic substrate. Otherwise, the optical waveguide module has a reflective surface coupled to the end of the optical waveguide and adapted to reflect the light emerging from or incident into the grating to form an optical path between the silicon photonic substrate and the optical waveguide for transmitting the light.

6 Claims, 7 Drawing Sheets

(51) Int. Cl.

| | | |
|---|---|---|
| H01L 21/306 | (2006.01) | |
| H01L 27/02 | (2006.01) | |
| H01L 33/20 | (2010.01) | |
| H01L 33/62 | (2010.01) | |
| H01L 21/768 | (2006.01) | |
| H01L 23/00 | (2006.01) | |
| H01S 5/02 | (2006.01) | |
| H01S 5/024 | (2006.01) | |
| H01S 5/026 | (2006.01) | |
| H01S 5/34 | (2006.01) | |
| G02B 6/34 | (2006.01) | |
| H01L 29/861 | (2006.01) | |
| H01L 23/60 | (2006.01) | |
| H01L 23/13 | (2006.01) | |
| H01L 23/14 | (2006.01) | |
| H01L 23/498 | (2006.01) | |
| H01L 21/48 | (2006.01) | |
| H01L 25/16 | (2006.01) | |

(52) U.S. Cl.
CPC ...... *H01L 21/30604* (2013.01); *H01L 21/486* (2013.01); *H01L 21/76898* (2013.01); *H01L 23/13* (2013.01); *H01L 23/147* (2013.01); *H01L 23/49827* (2013.01); *H01L 23/60* (2013.01); *H01L 24/16* (2013.01); *H01L 24/48* (2013.01); *H01L 27/0255* (2013.01); *H01L 29/861* (2013.01); *H01L 33/20* (2013.01); *H01L 33/62* (2013.01); *H01S 5/026* (2013.01); *H01S 5/0208* (2013.01); *H01S 5/02469* (2013.01); *H01S 5/34* (2013.01); *G02B 2006/12061* (2013.01); *H01L 24/05* (2013.01); *H01L 24/06* (2013.01); *H01L 24/08* (2013.01); *H01L 24/32* (2013.01); *H01L 24/80* (2013.01); *H01L 25/167* (2013.01); *H01L 2224/04* (2013.01); *H01L 2224/0401* (2013.01); *H01L 2224/04026* (2013.01); *H01L 2224/04042* (2013.01); *H01L 2224/05639* (2013.01); *H01L 2224/05644* (2013.01); *H01L 2224/05647* (2013.01); *H01L 2224/06102* (2013.01); *H01L 2224/08148* (2013.01); *H01L 2224/08238* (2013.01); *H01L 2224/16148* (2013.01); *H01L 2224/16238* (2013.01); *H01L 2224/29294* (2013.01); *H01L 2224/32148* (2013.01); *H01L 2224/32238* (2013.01); *H01L 2224/48091* (2013.01); *H01L 2224/48105* (2013.01); *H01L 2224/48148* (2013.01); *H01L 2224/48229* (2013.01); *H01L 2224/73265* (2013.01); *H01L 2224/80801* (2013.01); *H01L 2224/80805* (2013.01); *H01L 2224/81439* (2013.01); *H01L 2224/81444* (2013.01); *H01L 2224/81447* (2013.01); *H01L 2224/83439* (2013.01); *H01L 2224/83444* (2013.01); *H01L 2224/83447* (2013.01); *H01L 2224/83805* (2013.01); *H01L 2224/85439* (2013.01); *H01L 2224/85444* (2013.01); *H01L 2224/85447* (2013.01); *H01L 2924/00014* (2013.01); *H01L 2924/01322* (2013.01); *H01L 2924/12035* (2013.01); *H01L 2924/12041* (2013.01); *H01L 2924/12042* (2013.01); *H01L 2924/14* (2013.01); *H01L 2924/1434* (2013.01) *H01L 2933/0066* (2013.01)

(58) Field of Classification Search
CPC ............... H01L 23/49827; H01L 23/60; H01L 21/30604; H01L 21/486; H01L 21/76898; H01L 24/16; H01L 24/48; H01L 27/0255; H01L 29/861; H01L 33/20; H01L 33/62; H01S 5/0208; H01S 5/02469; H01S 5/026; H01S 5/34
USPC .......................................................... 385/14
See application file for complete search history.

(56) References Cited

U.S. PATENT DOCUMENTS

| | | | | |
|---|---|---|---|---|
| 6,624,444 | B1 * | 9/2003 | Li | H01L 31/12 257/59 |
| 6,722,792 | B2 * | 4/2004 | Raj | G02B 6/4214 385/30 |
| 6,789,959 | B1 | 9/2004 | Conn | |
| 6,841,842 | B2 * | 1/2005 | Li | H01L 31/12 257/431 |
| 6,952,504 | B2 * | 10/2005 | Bi | H01S 3/0632 359/245 |
| 6,975,812 | B1 * | 12/2005 | Kuhara | H04B 10/071 356/73.1 |
| 7,058,261 | B2 * | 6/2006 | Ghiron | G02B 6/12007 385/30 |
| 7,162,124 | B1 * | 1/2007 | Gunn, III | G02B 6/30 385/27 |
| 7,190,859 | B2 * | 3/2007 | Greiner | G02B 5/203 359/10 |
| 7,221,825 | B2 * | 5/2007 | Reed | G02B 6/12002 385/129 |
| 7,277,611 | B1 * | 10/2007 | Glebov | G02B 6/12002 385/14 |
| 7,480,429 | B1 * | 1/2009 | Chiniwalla | G02B 6/1228 385/129 |
| 7,660,500 | B2 * | 2/2010 | Konttinen | G02B 5/1809 353/31 |
| 8,257,990 | B2 * | 9/2012 | Koch | 257/E21.158 |
| 8,604,577 | B2 * | 12/2013 | Koch | 257/432 |
| 8,639,073 | B2 * | 1/2014 | Pelletier | G02B 6/30 385/37 |
| 8,998,509 | B2 * | 4/2015 | Thacker | G02B 6/4284 385/14 |
| 9,028,157 | B2 * | 5/2015 | Na | G02B 6/12 385/37 |
| 9,091,827 | B2 * | 7/2015 | Verslegers | G02B 6/34 |
| 9,201,200 | B2 * | 12/2015 | Bowen | G02B 6/30 |
| 9,274,275 | B2 * | 3/2016 | Webster | G02B 6/122 |
| 9,323,014 | B2 * | 4/2016 | Levy | G02B 6/425 |
| 2003/0183893 | A1 * | 10/2003 | Li | H01L 31/12 257/432 |
| 2003/0185484 | A1 * | 10/2003 | Chakravorty | G02B 6/42 385/14 |
| 2004/0036134 | A1 * | 2/2004 | Li | H01L 31/12 257/432 |
| 2004/0086011 | A1 * | 5/2004 | Bhandarkar | G02B 6/4206 372/50.21 |
| 2004/0101020 | A1 * | 5/2004 | Bhandarkar | G02B 6/4292 372/109 |
| 2004/0105476 | A1 * | 6/2004 | Wasserbauer | H01S 5/026 372/50.22 |
| 2004/0240788 | A1 * | 12/2004 | Zheng | G02B 6/42 385/37 |
| 2005/0069013 | A1 * | 3/2005 | Bhandarkar | G02B 6/4204 372/102 |
| 2005/0141808 | A1 * | 6/2005 | Cheben | G02B 6/12019 385/31 |
| 2006/0067617 | A1 * | 3/2006 | Gaylord | G02B 6/02085 385/37 |
| 2006/0239605 | A1 * | 10/2006 | Palen | G02B 6/4206 385/14 |
| 2009/0003762 | A1 * | 1/2009 | Chiniwalla | G02B 6/1228 385/14 |

(56) References Cited

U.S. PATENT DOCUMENTS

| | | | | |
|---|---|---|---|---|
| 2011/0069925 A1* | 3/2011 | Zheng | ............... | G02B 6/4201 385/14 |
| 2011/0158278 A1* | 6/2011 | Koch | ............... | G02B 6/4204 372/45.012 |
| 2012/0301149 A1* | 11/2012 | Pinguet | ............... | H01L 21/84 398/115 |
| 2013/0182994 A1* | 7/2013 | Castagna | ............... | G02B 6/4214 385/14 |
| 2013/0202246 A1* | 8/2013 | Meade | ............... | G02B 6/30 385/14 |
| 2013/0208752 A1* | 8/2013 | Koch | ............... | G02B 6/4204 372/45.012 |
| 2013/0230280 A1* | 9/2013 | Kadar-Kallen | ............... | G02B 6/4204 385/33 |
| 2013/0279844 A1* | 10/2013 | Na | ............... | G02B 6/12 385/14 |
| 2014/0029894 A1* | 1/2014 | Bowen | ............... | G02B 6/30 385/37 |
| 2014/0294342 A1* | 10/2014 | Offrein | ............... | G02B 6/4214 385/14 |
| 2015/0205062 A1* | 7/2015 | Collins | ............... | G02B 6/34 385/14 |

OTHER PUBLICATIONS

D.A. Louderback, et al., "VCSELs with monolithic coupling to internal horizontal waveguides using integrated diffraction gratings," Electronics Letters, Aug. 19, 2004, vol. 40, No. 17, pp. 1064-pp. 1065.

Dirk Taillaert, et al., "A Compact Two-dimensional Grating Coupler used as a Polarization Splitter," Photonics Technology Letters, IEEE, Sep. 2003, vol. 15, Issue: 9, pp. 1249-pp. 1251.

Jelena Vuckovic, et al., "Design of photonic crystal microcavities for cavity QED," Physical Review E, Dec. 21, 2001, vol. 65, pp. 016608-1-pp. 016608-11.

Keith A. Bates, et al., "Gaussian beams from variable groove depth grating couplers in planar waveguides," Applied Optics, Apr. 20, 1993, vol. 32, No. 12, pp. 2112-pp. 2116.

Shigeki Miyanag, et al., "Intensity profile of outgoing beams from uniform and linearly tapered grating couplers," Applied Optics, Feb. 15, 1981, vol. 20, No. 4, pp. 688-pp. 695.

* cited by examiner

OPTICAL COUPLING MODULE

CROSS-REFERENCE TO RELATED APPLICATION

This application claims the priority benefit of U.S. provisional application No. 61/871,319 filed on Aug. 29, 2013. The entirety of the above-mentioned patent application is hereby incorporated by reference herein and made a part of this specification.

TECHNICAL FIELD

The disclosure is related to an optical coupling module for optically coupling a silicon photonic substrate and an optical waveguide.

BACKGROUND

In recent years, as a result of storage capacity expansion, processing speed increase, and device volume reduction of optical communication systems, technology of implementing a photonic-based electronic circuit portion and optical circuit portion in one chip is gradually getting more and more attentions.

Specifically, an optical coupling device is implemented and optically coupled with an external element using a grating coupler or a side coupler formed on a silicon photonics chip. The optical coupling device is coupled between a planar optical waveguide on the silicon photonic chip and an optical fiber. The method of coupling the optical fiber and the optical waveguide on the silicon photonic chip could be generally classified into two kinds, side coupling and grating coupling. The side coupling implemented through a side coupler formed on the silicon photonics chip works independently of the wavelength. However, the side coupler has a very small optical alignment tolerance between the silicon photonic chip and the optical fiber.

On the other hand, the grating coupling is the method of directly coupling the light (or optical signal) into the optical waveguide through the gratings. The grating coupler has larger optical alignment tolerance; however, it is sensitive to the wavelength. Otherwise, in the current silicon photonic chip packaging design, through the coupling between the gratings and the optical waveguide could increase the alignment tolerance. Nevertheless, owing to the approximately perpendicular angle, about 10 degrees to 20 degrees, between the gratings and optical waveguide, there might the concerns in the difficulties of processing the optical alignments between the gratings on the silicon photonic chip and optical waveguide.

SUMMARY

The present disclosure is directed to an optical coupling module, wherein the optical coupling module includes the grating and planar optical waveguide on the silicon photonic substrate, and another optical waveguide fixed by the interposer or holder, so as to transmit the incident light from the light source through the silicon photonic substrate to the optical waveguide, or vice versa.

One of exemplary embodiments provides an optical coupling module which includes a silicon photonic substrate, and an optical waveguide module. The silicon photonic substrate is adapted to transmit a light. The silicon photonic substrate has a first surface and a first grating on the first surface for diffracting the light which passes through the first grating. The optical waveguide module is disposed on the silicon photonic substrate, wherein the optical waveguide module includes an optical waveguide having an end disposed corresponding to the first grating of the silicon substrate. Otherwise, the optical waveguide module has a reflective surface coupled to the end of the optical waveguide and adapted to reflect the light emerging from or incident into the first grating to form an optical path between the silicon photonic substrate and the optical waveguide for transmitting the light.

Based on the aforementioned description, the optical coupling module includes the silicon photonic substrate and the optical waveguide, wherein the silicon photonic substrate is optically coupled with the optical waveguide. Otherwise, a reflective surface is disposed at the end of the optical waveguide, wherein the reflective surface is formed at angel relative to the longitudinal axis of the optical waveguide. Moreover, the magnitude of the relative angle between the reflective surface and the longitudinal axis of the optical waveguide is depending on the reflecting path of the light. Furthermore, the gratings are disposed at the ends of the silicon photonic substrate and the optical waveguide for diffracting the incident light. The reflective angle of the light can be changed through the alignments of the gratings and the optical waveguides. Therefore, the alignment tolerance and optical coupling efficiency could be enhanced through the configuration of the gratings and the reflective surface. Otherwise, owing to the silicon photonic substrate can be optically aligned with the optical waveguide through the above-mentioned configurations which has the greater alignment tolerance. Therefore, there is no need of forming the positioning alignments such as v-grooves on the limited surface area of the silicon photonic substrate. As a result, the manufacturing cost and time consuming on processing the silicon photonic substrate can be further reduced or minimized, which may enhance the productivity and manufacturing efficiency due to the simplified structure and lower processing cost.

To make the above features and advantages of the disclosure more comprehensible, several embodiments accompanied with drawings are described in detail as follows.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1:
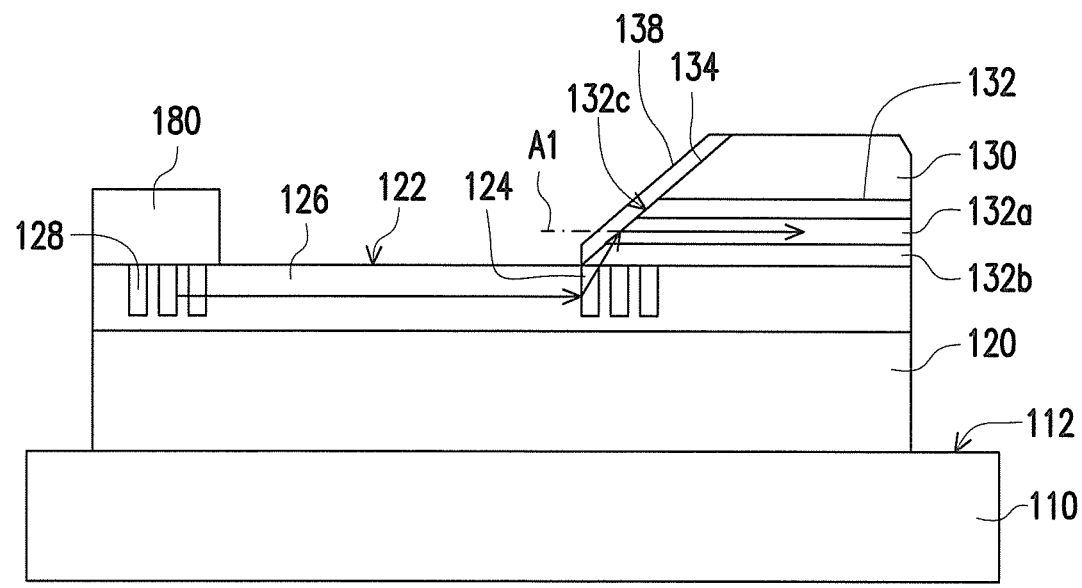
FIG. 1 a schematic view of the optical coupling module according to an exemplary embodiment.

It is to be understood that both of the foregoing and other detailed descriptions, features, and advantages are intended to be described more comprehensively by providing embodiments accompanied with Figures hereinafter. In the following embodiments, wordings used to indicate directions, such as "up," "down," "front," "back," "left," and "right", merely refer to directions in the accompanying drawings. Therefore, the directional wording is used to illustrate rather than limit the exemplary embodiments. The present embodiment is approximately identical to the other embodiments, and same or similar reference numerals used in the different embodiments represent the same or similar elements.

FIG. 1 is a schematic view of optical coupling module according to an exemplary embodiment. Referring to FIG. 1, in the present embodiment, the optical coupling module 100 may include a carrier 110, a silicon photonic substrate 120, and an optical waveguide module 130. The carrier 110 has a carrying surface 112 for carrying the silicon photonic substrate 120 and optical waveguide module 130 successively. The silicon photonic substrate 120 is bonded to the carrying surface 112 of the carrier 110 and adapted to transmit the light (i.e., optical signal), wherein the silicon photonic substrate 120 has a first surface 122 and at least one first grating 124 disposed on the first surface 122 for the light which passes through the first grating 124. The optical waveguide module 130 is bonded to the carrier through the silicon photonic substrate 120 and includes an optical waveguide 132 for holding the light within. In the present embodiment, the optical waveguide 132 may be an optical fiber which further includes a core 132a for transmitting the light and a cladding 132b for covering the core 132a and confining the light within the core 132a by total internal reflection. Otherwise, the carrier 110 and optical waveguide module 130 of the present embodiment may be formed by the glass substrates, the silicon substrates, or the ceramic substrates. However, the present embodiment is not limited herein.

Besides, the optical waveguide 132 has an end 132c disposed in corresponding to the first grating 124 of the silicon photonic substrate 120. The optical waveguide module 130 has a reflective surface 134 coupled to the end 132c of the optical waveguide 132 and adapted to reflect the light emerging from or incident into the first grating 124 to form an optical path between the silicon photonic substrate 120 and the optical waveguide 132 for transmitting the light. In addition, a reflective coating layer 138 may be disposed on the reflective surface 134, wherein the reflective coating layer 138 may be composed of gold, silver, copper, aluminum, chromium, or the combination thereof. In the present embodiment, the reflective surface 134 may be set at an angle relative to a longitudinal axis A1 of the optical waveguide 132. Otherwise, the end 132c of the optical waveguide 132 may be also formed as a reflective surface in compliance with the reflective surface 134 of the optical waveguide module 130. Furthermore, in the present embodiment, the optical waveguide 132 might be physical contact with or proximately close to the first grating 124 on the first surface 122. Therefore, through the aforementioned configuration, the coupling loss of the optical coupling module 100 can be limited to around 3 dB. Particularly, through thinning the thickness of the cladding 132b, the coupling loss of the present optical coupling module 100 can be further lowering to below 3 dB.

Specifically, the angle of the reflective surface 134 relative to the perpendicular direction of the longitudinal axis A1 of the optical waveguide 132 may be ranged from 30 degrees to 70 degrees. In some more preferable examples, the aforementioned angle of the reflective surface 134 is at 32 degrees when the light emits at a wavelength of 1310 nm and at 51 degrees when the light emits at a wavelength of 1551 nm. In the present embodiment, the first grating 124 on the first surface 122 of the silicon photonic substrate 120 may be formed at an angle at which the light passing through may be diffracted, which causes the light to leak out in a specific direction. For example, in the present embodiment, the angle of the first grating 124 relative to the normal line of the first surface 122 of the silicon photonic substrate 120 may be ranged from 10 degrees to 30 degrees.

Referring again to FIG. 1, the optical waveguide 132 may transmit the light from a light source 180, and the light may pass through the silicon photonic substrate 120 to the first grating 124. The light is diffracted through the first grating 124 and coupled into the end 132c of the optical waveguide 132. In the present embodiment, the end 132c of the optical waveguide 132 may be coated with the reflective material for destroying the total reflection of the light. The reflective material may be composed of, for example but not limited to, gold, silver, copper, aluminum, chromium, or the combination thereof. The reflectivity of the aforementioned reflective materials is above 90%, and the selectivity of the reflective material might be depending on the varying wavelengths of the light.

On the other hand, the silicon photonic substrate 120 may further include a silicon waveguide 126 disposed close to the first surface 122 and corresponding to the light source 180, wherein the grating 128 is disposed along the longitudinal direction of silicon photonic substrate 120 for transmitting the light. In the present embodiment, a laser source may be utilized as the light source 180 to emit the laser light. Besides, at least one grating 128 may be disposed at the silicon waveguide 126 and corresponding to the light source 180 for receiving and diffracting the light incident from the light source 180. Furthermore, the silicon photonic substrate 120 may be bonded on the carrying surface 112 of the carrier 110 through flip chip bonding or wire bonding. Accordingly, through the configuration of the silicon photonic substrate 120, optical waveguide 132, and the carrier 110, the silicon photonic substrate 120 may ensure that the light source 180 is optically connected with the silicon waveguide 126 in the silicon photonic substrate 120 and the optical waveguide module 130 to transmit and receive the light (i.e., optical signal).

Furthermore, in the present embodiment, a plurality of anti-reflective coating layers (not illustrated) might be disposed on the interface between the optical waveguide 132 and the first grating 124 to protect against light leak and loss due to the reflection during the light transmission. The anti-reflective coating layers might be composed of, for example, a refractive index matching liquid, wherein the magnitude of the refractive index of the refractive index matching liquid is between the refractive indices of the optical waveguide 132 and the first grating 124.

Figure 2:
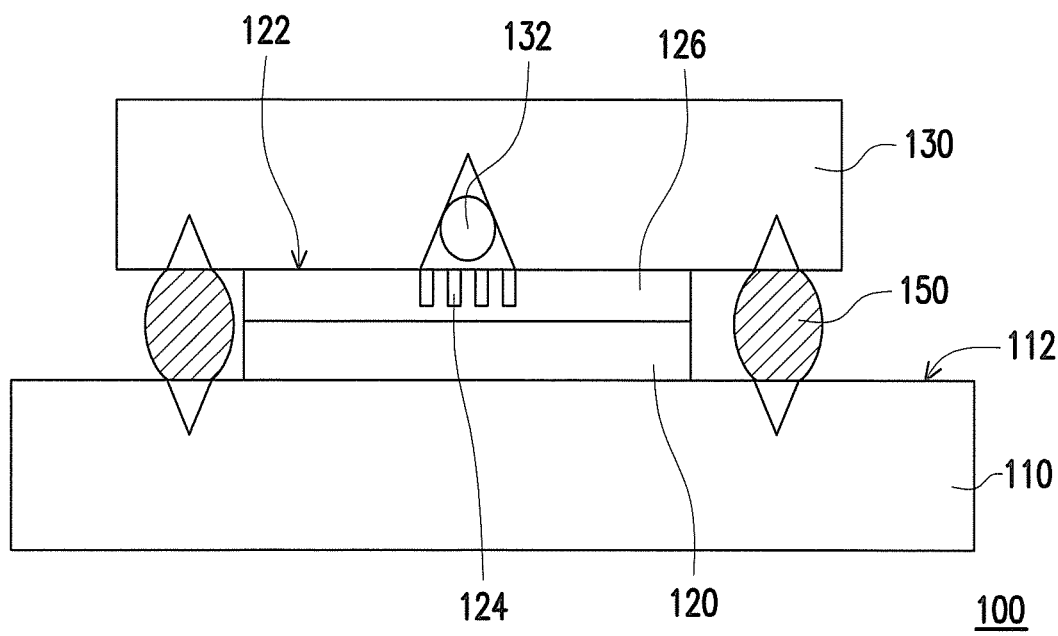
FIG. 2 is the schematic side view of the optical coupling module of FIG. 1.

FIG. 2 is the schematic side view of the optical coupling module of FIG. 1. Referring to FIG. 2, the optical waveguide module 130 may be bonded to the carrying surface 112 of the carrier 110 through, for example, solder bumps for aligning the relative positions of the optical waveguide module 130 and the carrier 110, and otherwise spacing therebetween. Besides, in the present embodiment, the silicon photonic substrate 120 is disposed between the optical waveguide module 130 and the carrier 110, wherein the silicon photonic substrate 120 is bonded on the carrying surface 112 of the carrier 110 and aligning with the optical waveguide 132. Through the above-mentioned configuration, there is no need of forming any kind of positioning elements such as v-grooves on the limited surface area of the silicon photonic substrate 120 for aligning the optical waveguide 132. Thus, the manufacturing cost and time consuming of the aligning process between the silicon photonic substrate 120 and the optical waveguide 132 could be greatly reduced, and otherwise, the size of the silicon photonic substrate 120 could be further minimized.

Figure 3A:
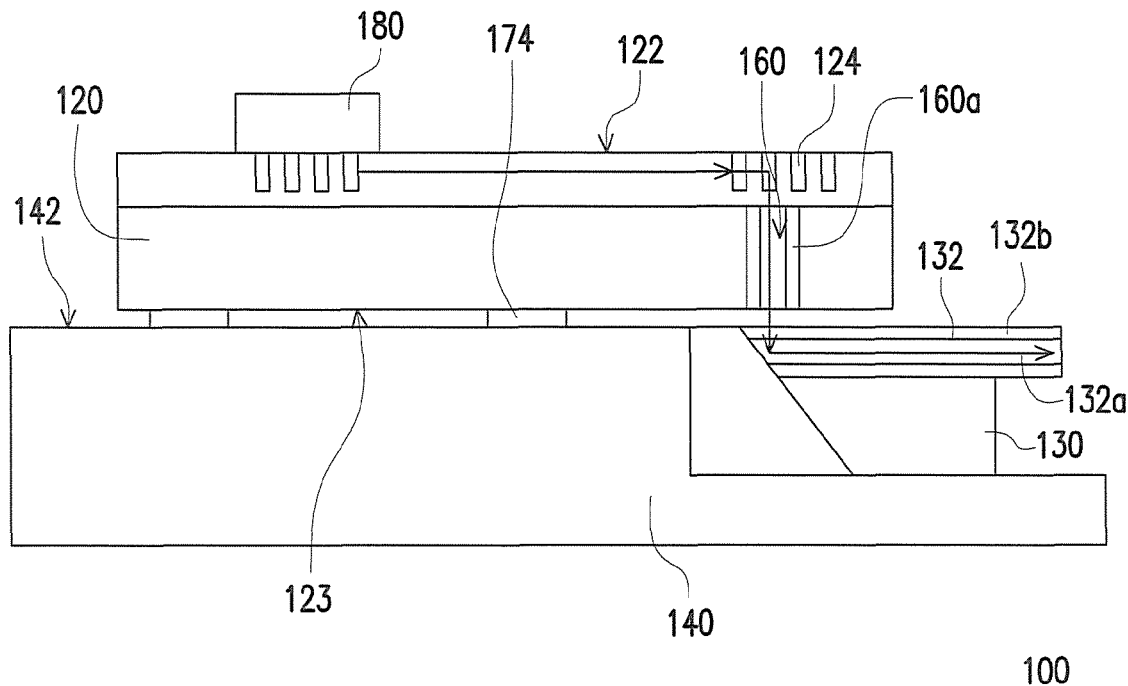
FIG. 3A is the schematic view of the optical coupling module according to another exemplary embodiment.
Figure 3B:
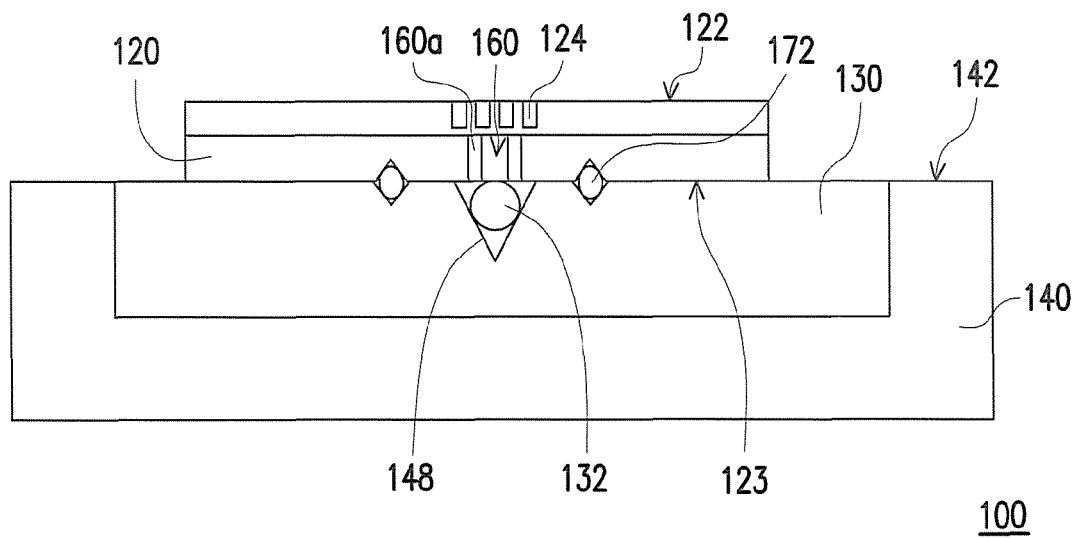
FIG. 3B is the schematic side view of the optical coupling module of FIG. 3A.

FIG. 3 is the schematic view of the optical coupling module according to another exemplary embodiment. FIG. 3B is the schematic side view of the optical coupling module of 3A. Referring to 3A and 3B, in the present embodiment, the silicon photonic substrate 120 further includes a second surface 123 opposite the first surface 122, and the interposer 140 further includes a third surface 142. Otherwise, the silicon photonic substrate 120 is bonded to the interposer 140 by facing the second surface 123 to the third surface 142 of the interposer 140 through the positioning element such as the alignment pads 174 or v-grooves. Moreover, the optical waveguide 132 might be fixed on the interposer 140 through a v-groove 148. In the present embodiment, a light guiding portion 160, such as a light guiding hole, may be disposed between the first grating 124 on the first surface 122 and the second surface 123 of the silicon photonic substrate 120 for transmitting the light between the first grating 124 and the optical waveguide 132. Specifically, the light guiding portion 160 might be composed of at least one light guiding hole formed in the silicon photonic substrate 120 through etching, mechanical or laser drilling. Furthermore, a metal reflective layer 160a may be deposited on the wall of the light guiding portion 160, so as to enhance the light reflecting effects. Accordingly, as the light is diffracted from the first grating 124 and passing through the light guiding portion 160, the light is effectively converged inside of the light guiding portion 160 without loss to the exterior, thus the effectiveness of the light transmitting is enhanced.

Figure 4A:
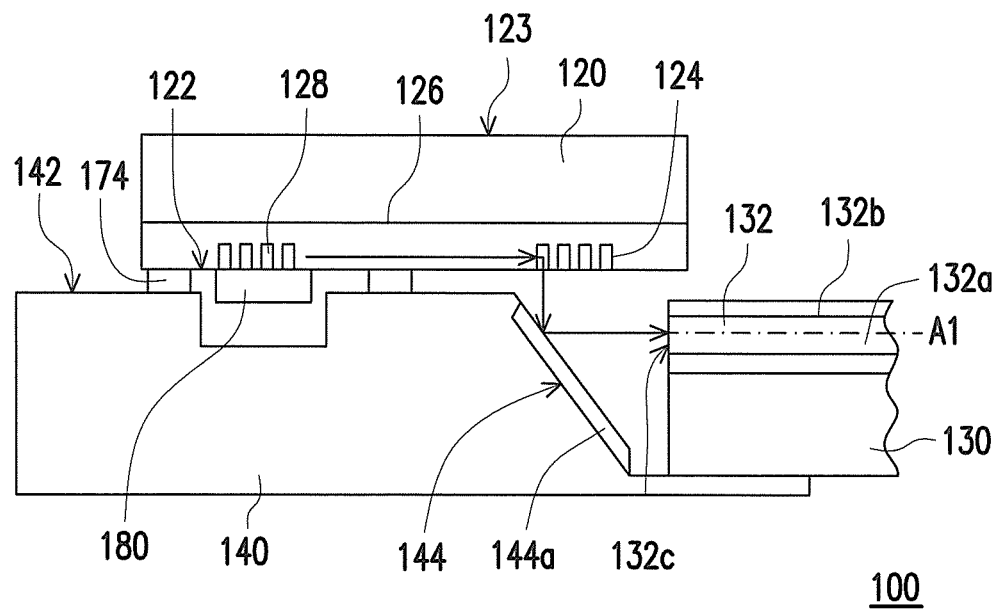
FIG. 4A is the schematic view of the optical coupling module according to another exemplary embodiment.
Figure 4B:
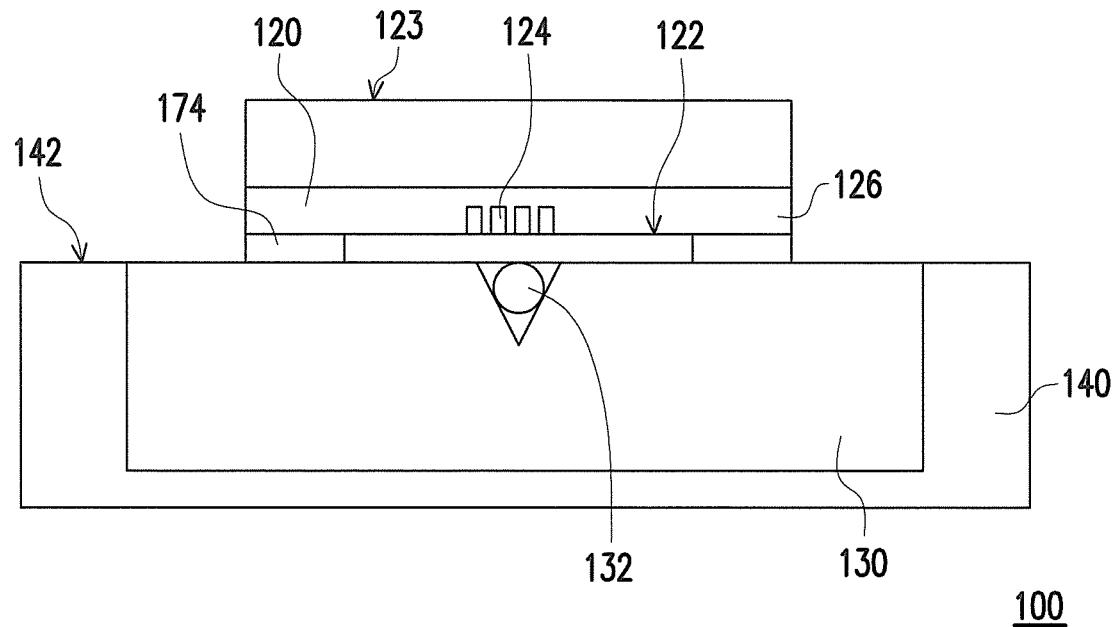
FIG. 4B is the schematic side view of the optical coupling module of the FIG. 4A.

FIG. 4 is the schematic view of the optical coupling module according to another exemplary embodiment. FIG. 4B is the schematic side view of the optical coupling module of the FIG. 4A. Referring to the FIG. 4A and FIG. 4B, in the present embodiment, the silicon photonic substrate 120 is bonded to the interposer 140 by facing the first surface 122 to the third surface 142 of the interposer 140 through the bonding method such as flip-chip bonding or the alignment pads 174. In the present embodiment, the end 132c of the optical waveguide 132 is located over the third surface 142 and aligned with the first grating 124, wherein the optical waveguide 132 may be fixed to the interposer 140 though the positioning elements such as v-grooves. Moreover, a reflective surface 144 is formed on the interposer 140 and faces the end 132c of the optical waveguide 132. The reflective surface 144 of the interposer 140 of the present embodiment is set at an angle relative to the longitudinal axis A1 of the optical waveguide 132. For instance, but not limited to, the angle of reflective surface 144 of the interposer 140 relative to the perpendicular direction of the longitudinal axis A1 of the optical waveguide 132 is ranged from 30 degrees to 70 degrees. Besides, the reflective surface 144 might be further coated with metal reflective coating layer 144a to reflect the light diffracted from the first gratings 124 to the optical waveguide 132 for transmitting the light incident from the light source 180. In the present embodiment, owing to the alignment method of flip-chip bonding between the silicon photonic substrate 120 and the interposer 140, there is no need of further forming positioning alignments such as v-grooves on the silicon photonic substrate, thereby the cost of the aligning process of optical coupling module packaging could be further reduced.

Figure 5A:
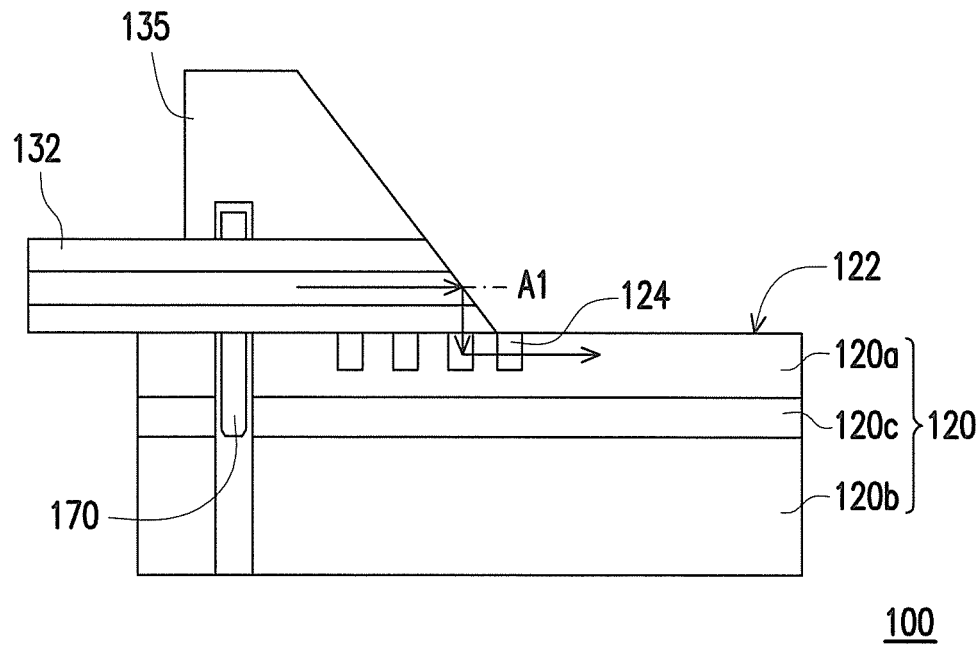
FIG. 5A is the schematic view of the optical coupling module according to another exemplary embodiment.
Figure 5B:
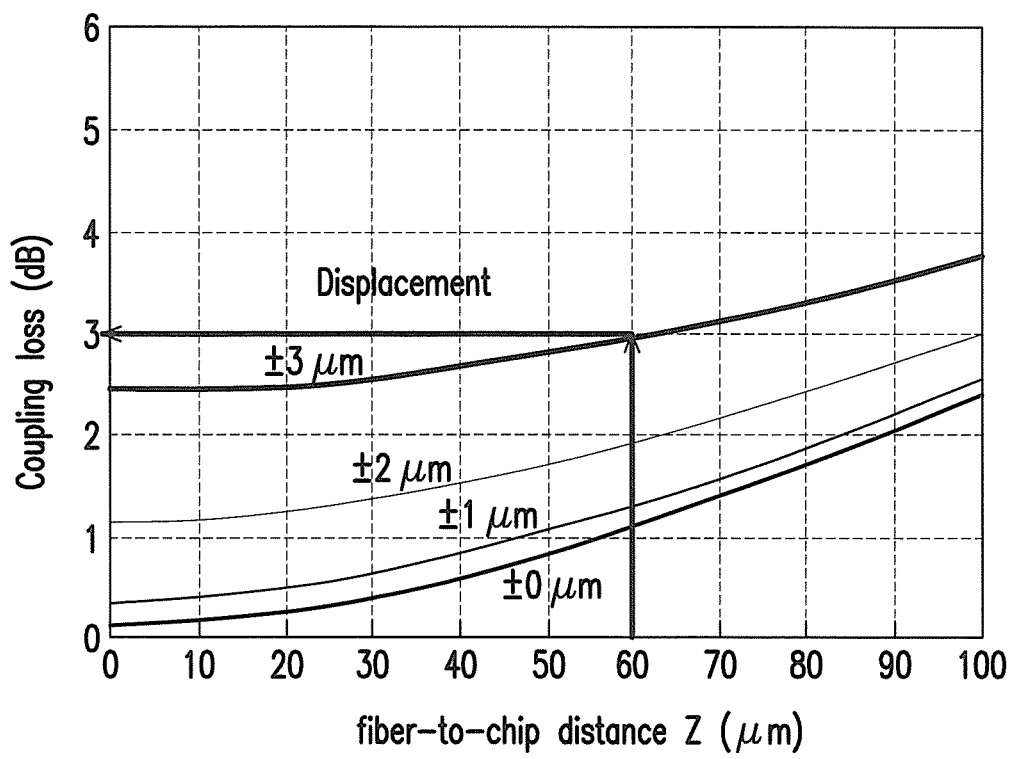
FIG. 5B is an optical simulation data diagram of the optical coupling module of FIG. 5A.

FIG. 5A is the schematic view of the optical coupling module according to another exemplary embodiment. FIG. 5B is an optical simulation data diagram of the optical coupling module corresponding to FIG. 5A. Referring to FIG. 5A, the optical coupling module 100 may further include a holder 135 for holding the optical waveguide 132, wherein the holder 135 is fixed on the silicon photonic substrate 120 and the interposer 140 through the positioning elements 170. Therefore, in the present embodiment, the alignments between the silicon photonic substrate 120, the interposer 140, and the optical waveguide 132 in different axis directions could be implemented through the positioning elements 170. Moreover, the positioning elements 170 might adjust the vertical height of the gap between the optical waveguide 132 and the silicon photonic substrate 120 in the perpendicular direction (i.e., Z-axis direction) of the first surface 122 of the silicon photonic substrate 120. In addition, in the present embodiment, the silicon photonic substrate 120 might be a Silicon-on-Insulator (SOI) substrate which includes a silicon layer 120a for transmitting the light, a silicon substrate layer 120b and a buried oxide layer 120c therebetween. Referring to FIG. 5B, the simulation data of FIG. 5B indicates the relations between the optical waveguide 132 (e.g., fiber) to silicon photonic substrate 120 (e.g., SOI chip) distance and the coupling loss. In the present embodiment, as the optical waveguide 132 is physical contact with or proximately close to the silicon photonic substrate (i.e., the optical waveguide 132 to silicon photonic substrate 120 distance is smaller than 60 µm), the coupling loss of the optical coupling between the silicon photonic substrate 120 and the optical waveguide 132 can be limited to below 3 dB.

Figure 6A:
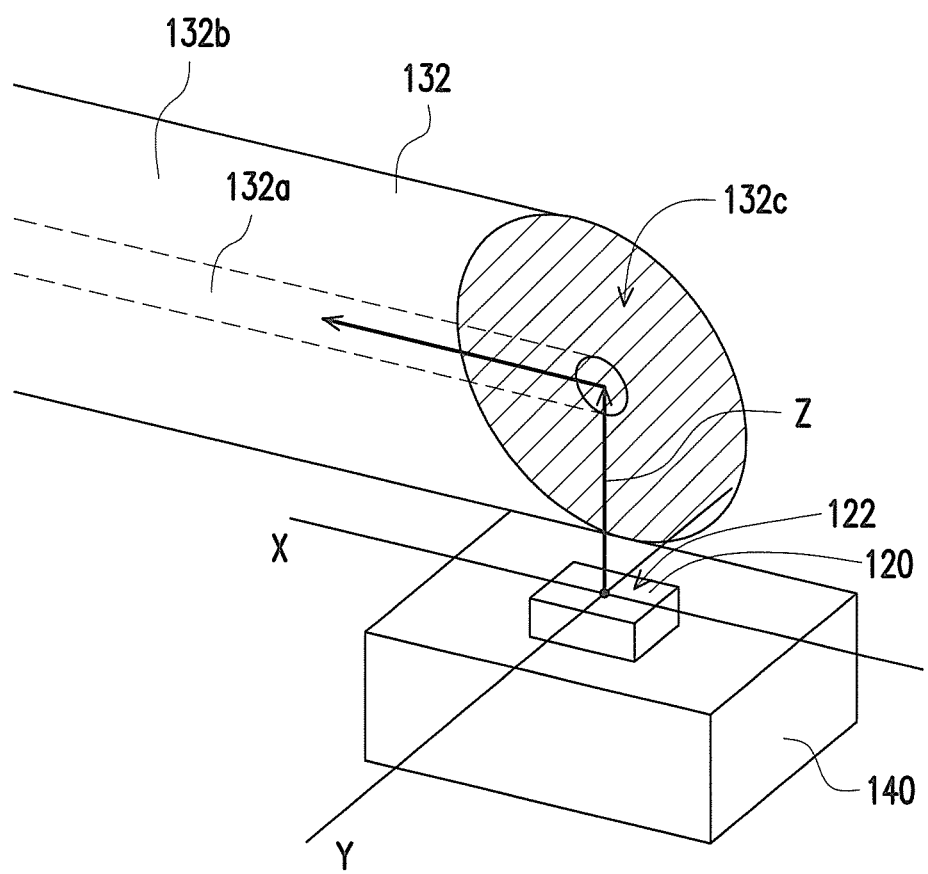
FIG. 6A is a schematic perspective view of the optical coupling module of FIG. 5A.
Figure 6B:
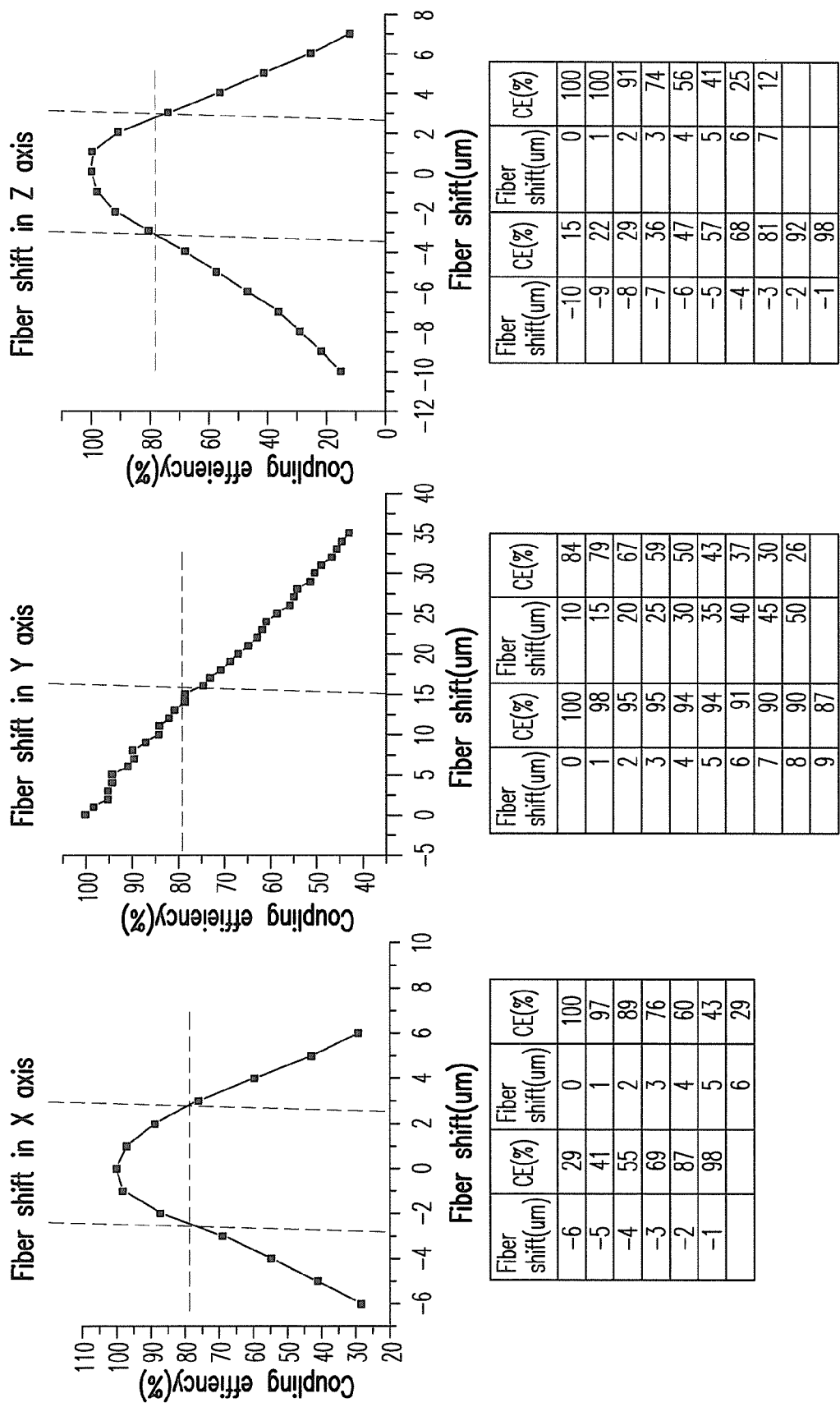
FIG. 6B is optical simulation data diagrams of the optical coupling module of FIG. 6A.

FIG. 6A is a schematic perspective view of the optical coupling module of FIG. 5A. FIG. 6B is the optical simulation data diagrams of the optical coupling module of FIG. 6A. Referring to FIG. 5A and FIG. 6A, the optical waveguide 132 may be aligned with the silicon photonic substrate 120 further in the directions of X, Y, Z axes through the positioning elements 170. In the present embodiment, the optical waveguide 132 might be shifted along the different axis directions relatively to the silicon photonic substrate 120. Referring to the FIG. 6B, as the optical waveguide 132 is shifted along the X-axis, the misalignment tolerance at 1 dB of the coupling loss is around 5 µm. Besides, as the optical waveguide 132 is shifted along the Y-axis, the misalignment tolerance at 1 dB of the coupling loss is around 15 µm. Moreover, as the optical waveguide 132 is shifted along the Z-axis, the misalignment tolerance at 1 dB of the coupling loss is around 6 µm.

Figure 7:
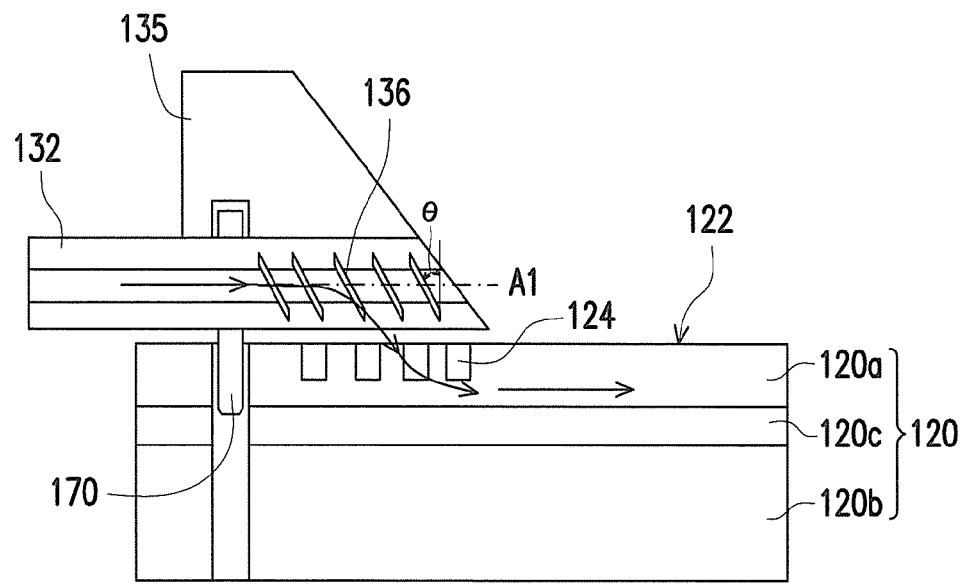
FIG. 7 is the schematic view of the optical coupling module according to another exemplary embodiment.

FIG. 7 is the schematic view of the optical coupling module according to another exemplary embodiment. Referring to FIG. 7, in the present embodiment, at least one second grating 136 may be formed at the end optical waveguide 132 and aligned corresponding to the first grating 124 on the first surface 122 of the silicon photonic substrate 120. Otherwise, the second grating 136 is gradually changed from being perpendicular to the longitudinal axis A1 of the optical waveguide 132 to being tilted at a specific angle θ relatively to the perpendicular direction of the longitudinal axis A1 of the optical waveguide 132. The aforementioned specific tilting angle θ is matched up with the light emitting angle of the first grating 124 on the first surface 122. For example, the titling angle θ of the second grating 136 may be ranged from 15 degrees to 45 degrees in the present embodiment for redirecting the light at angles other than 90 degrees. The light passing through the optical waveguide 132 will be diffracted through the second grating 136, then redirected and coupled into the first grating 124 of the silicon photonic substrate 120. In the present embodiment, the light receiving angle of the first grating 124 relative to the normal line of the first surface 122 is ranged from 6 degrees to 12 degrees. Otherwise, in the present embodiment, the period of the first grating 124 is matching with the second grating 136.

Figure 8:
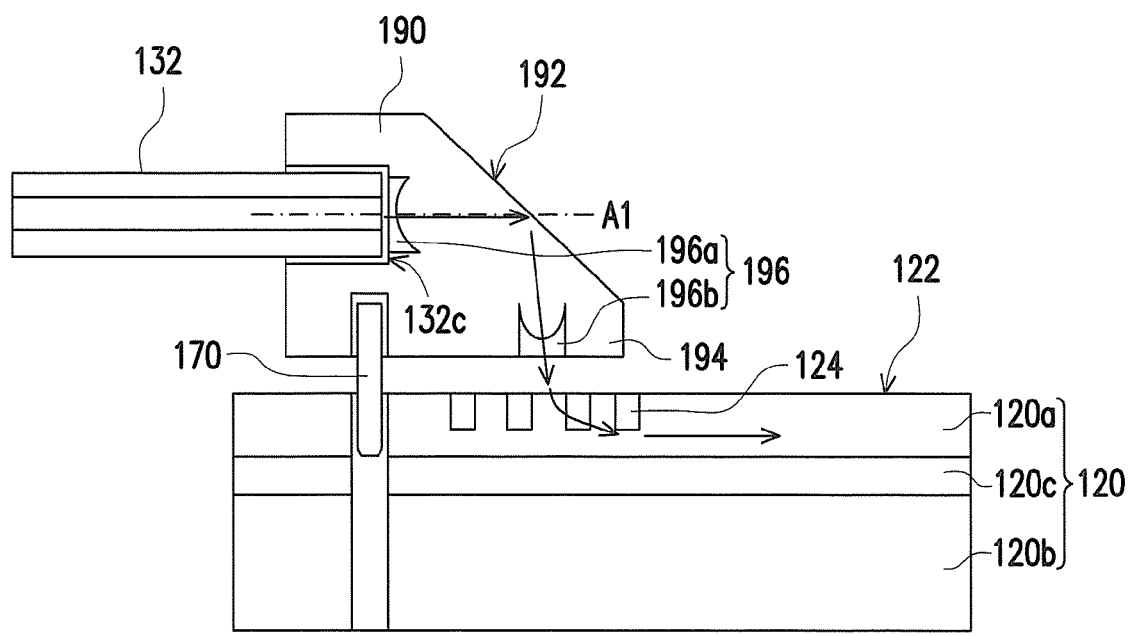
FIG. 8 is the schematic view of the optical coupling module according to another exemplary embodiment.

FIG. 8 is the schematic view of the optical coupling module according to another exemplary embodiment. The optical coupling module of the FIG. 8 of the present embodiment further includes an optical packaging mechanism 190 disposed between the first grating 124 of the silicon photonic substrate 120 and the end 132c of the optical waveguide 132. The optical packaging mechanism 190 is bonded to silicon photonic substrate 120 through a plurality of the positioning elements 170. In the present embodiment, the optical packaging mechanism 190 includes a reflective surface 192, an optical waveguide holder 194, and an external lens 196. The reflective surface 192 is aligned with the reflecting paths of the light, and the holder 194 may be aligned along the longitudinal axis A1 of the optical waveguide 132 to be paralleled to the silicon photonic substrate 120. Moreover, the external lens 196 is disposed corresponding to the first grating 124 of the silicon photonic substrate 120 and end 132c of the optical waveguide 132.

In the present embodiment, the external lens 196 includes a first lens 196a and a second lens 196b respectively disposed corresponding to the end 132c of the optical waveguide 132 and the first grating 124 of the silicon photonic substrate 120. The light is incident from the optical waveguide 132 and refracted through the first lens 196a. The first lens 196a may be a collimator lens which directs the light to the reflective surface 192. Otherwise, the reflective surface 192 may be coated with the reflective coating to destruct the total refection of the light. On the other hand, the light is reflected through the reflective surface 192 at a specific reflecting angle ranged from 30 degrees to 70 degrees, and then reflected into the second lens 196b. The propagating light is coupled into the first grating 124 of the silicon photonic substrate 120 through adjusting and positioning the second lens 196b. In the present embodiment, the relative position between the optical packaging mechanism 190 and silicon photonic substrate 120 is adjusted through the positioning elements 170, so as to fulfill the requirement of alignment accuracy.

In summary, the optical coupling module includes the silicon photonic substrate and the optical waveguide, wherein the silicon photonic substrate is optically coupled with the optical waveguide to form an optical path for the light (or optical signal) transmission. Otherwise, a reflective surface is disposed at the end of the optical waveguide and tilted relatively to the longitudinal axis of the optical waveguide with an angle at which the incident light is reflected. Moreover, the gratings are respectively disposed at the end of the optical waveguide and on the surface of the silicon photonic substrate correspondingly to the reflective surface of the optical waveguide. Furthermore, the reflective angle of the light can be changed through aligning the gratings and the reflective surface of optical waveguide at a specific relative angle. Therefore, the alignment tolerance and optical coupling efficiency could be enhanced through the alignment between the gratings of the silicon photonic substrate and the reflective surface of the optical waveguide. Thus, the size of optical coupling module and the silicon photonic substrate thereof can be further minimized. Otherwise, with the above-mentioned configuration, there is no need of forming positioning elements such as the v-grooves on the limited surface area of the silicon photonic substrate for aligning. As a result, the manufacturing cost and time consuming on the aligning process of the optical coupling module could be greatly reduced, such that the applications of the optical coupling module will be even more prevailed.

Although the disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. An optical coupling module, comprising:
   a silicon photonic substrate adapted to transmit a light, wherein the silicon photonic substrate has a first surface and a second surface opposite to the first surface, a first grating disposed in the first surface for diffracting the light which passes through the first grating;
   an optical waveguide module disposed on the second surface of the silicon photonic substrate, wherein the optical waveguide module comprises an optical waveguide having an end disposed in corresponding to the first grating of the silicon photonic substrate; and
   an interposer, wherein the silicon photonic substrate is bonded to the interposer by facing the second surface to the interposer and a light guiding portion is disposed between the first grating and the second surface and penetrates through the silicon photonic substrate for transmitting the light between the first grating and the end of the optical waveguide.

2. The optical coupling module as claimed in claim 1, wherein the optical waveguide module is fixed to the interposer.

3. The optical coupling module as claimed in claim 1, wherein the reflective surface is formed on the interposer and faces the end of the optical waveguide.

4. The optical coupling module as claimed in claim 1, wherein the reflective surface is set at an angle relative to a longitudinal axis of the optical waveguide, and the angle is ranged from 30 degrees to 70 degrees.

5. The optical coupling module as claimed in claim 1, wherein the optical waveguide is a fiber.

6. An optical coupling module, comprising:
   a silicon photonic substrate adapted to transmit a light, wherein the silicon photonic substrate has a first surface and a second surface opposite to the first surface, a first grating disposed on the first surface for diffracting the light which passes through the first grating;
   an optical waveguide module disposed on the silicon photonic substrate, wherein the optical waveguide module comprises an optical waveguide having an end disposed in corresponding to the first grating of the silicon photonic substrate, and the optical waveguide module has a reflective surface coupled to the end of the optical waveguide and adapted to reflect the light emerging from or incident into the first grating, to form an optical path between the silicon photonic substrate and the optical waveguide for transmitting the light; and an interposer, wherein the silicon photonic substrate is bonded to the interposer by facing the second surface to the interposer and a light guiding portion is disposed between the first grating and the second surface for transmitting the light between the first grating and the end of the optical waveguide, the light guiding portion is composed of at least one light guiding hole, and at least one metal reflective layer is on the wall of the light guiding hole.

* * * * *